(12) United States Patent
White

(10) Patent No.: US 9,140,828 B2
(45) Date of Patent: Sep. 22, 2015

(54) APPARATUS AND ASSOCIATED METHODS RELATED TO DETECTION OF ELECTROMAGNETIC SIGNALLING

(75) Inventor: Richard White, Huntingdon (GB)

(73) Assignee: Nokia Technologies Oy, Espoo (FI)

( * ) Notice: Subject to any disclaimer, the term of this patent is extended or adjusted under 35 U.S.C. 154(b) by 139 days.

(21) Appl. No.: 13/547,248

(22) Filed: Jul. 12, 2012

(65) Prior Publication Data

US 2013/0026441 A1   Jan. 31, 2013

Related U.S. Application Data

(60) Provisional application No. 61/512,137, filed on Jul. 27, 2011.

(51) Int. Cl.
| | | |
|---|---|---|
| H01L 21/00 | (2006.01) | |
| G02B 5/00 | (2006.01) | |
| H01L 31/0352 | (2006.01) | |
| H01L 31/09 | (2006.01) | |
| G02B 5/20 | (2006.01) | |
| B82Y 20/00 | (2011.01) | |
| H01L 31/0232 | (2014.01) | |

(52) U.S. Cl.
CPC ............... *G02B 5/008* (2013.01); *B82Y 20/00* (2013.01); *G02B 5/201* (2013.01); *G02B 5/206* (2013.01); *H01L 31/0232* (2013.01); *H01L 31/035209* (2013.01); *H01L 31/09* (2013.01); *G02B 2207/101* (2013.01)

(58) Field of Classification Search
CPC .................................................... H01L 31/0232
USPC ............... 257/9, E31.011; 136/252; 359/238
See application file for complete search history.

(56) References Cited

U.S. PATENT DOCUMENTS

| | | | | |
|---|---|---|---|---|
| 8,680,455 | B2* | 3/2014 | Salsman | 250/208.1 |
| 2010/0126567 | A1* | 5/2010 | Kaufman | 136/252 |
| 2010/0288356 | A1 | 11/2010 | Linic et al. | |
| 2011/0116168 | A1 | 5/2011 | Nikoobakht | |
| 2013/0026441 | A1* | 1/2013 | White | 257/9 |
| 2013/0081693 | A1* | 4/2013 | Kaufman | 136/257 |
| 2013/0120752 | A1* | 5/2013 | Lee et al. | 356/445 |
| 2013/0193404 | A1* | 8/2013 | Koppens et al. | 257/9 |
| 2013/0285012 | A1* | 10/2013 | Lee et al. | 257/13 |
| 2013/0309456 | A1* | 11/2013 | Bowers et al. | 428/192 |
| 2014/0000805 | A1* | 1/2014 | Bowers et al. | 156/324 |
| 2014/0023321 | A1* | 1/2014 | Lu et al. | 385/40 |
| 2014/0070082 | A1* | 3/2014 | Guo et al. | 250/227.14 |

OTHER PUBLICATIONS

Bonaccorso, F., et al., "Graphene photonics and optoelectronics", © 2010 Macmillan Publishers Ltd., 12 pgs.

(Continued)

*Primary Examiner* — Michael Shingleton
(74) *Attorney, Agent, or Firm* — Harrington & Smith

(57) ABSTRACT

In one or more embodiments described herein, there is provided an apparatus including a first layer for detecting electromagnetic signalling, and a second layer positioned proximate to the first layer. The first layer includes graphene, and the second layer is configured to undergo plasmonic resonance in response to receiving electromagnetic signalling. This plasmonic resonance that the second layer undergoes thereby sensitizes the graphene of the first layer to detection of particular spectral characteristics of received electromagnetic signalling corresponding to the particular plasmonic resonance of the second layer.

12 Claims, 7 Drawing Sheets

(56) References Cited

OTHER PUBLICATIONS

Radoi, A., et al., "Ultrabroadband photodetection based on grapheme ink", © 2010 IOP Publishing Ltd., 6 pgs.

Cole, Robin M., et al., "Understanding Plasmons in Nanoscale Voids", © 2007 American Chemical Society, 7 pgs.

Mueller, Thomas, et al., "Graphene photodetectors for high-speed optical communications", © 2010 Macmillan Publishers Ltd., 5 pgs.

*Understanding Plasmons in Nanoscale Voids*; Robin M. Cole,*, Jeremy J. Baumberg,*, F. J. Garcia de Abajo,§ Sumeet Mahajan, Mamdouh Abdelsalam, and Philip N. Bartlett; University of Southampton, Southampton, United Kingdom, and Instituto de Optica, CSIC, Madrid, Spain-Received May 4, 2007; Revised Manuscript Received May 31, 2007 (7 pages).

"Graphene photodetectors for high-speed optical communications;" Thomas Mueller, Fengnian Xia and Phaedon Avouris; *Nature Photonics*, Letters published online: Mar. 28, 2012 (5 pages).

T.J. Echtermeyer et al. 'Strong Plasmonic Enhancement of Photovoltage in GraphenelarXiv:1107.4176v1; Jul. 21, 2011 (6 pages).

N. Papasimakis et al. "Graphene in a photon c metamateriall Optics Express," vol. 18, No. 8, pp. 8353-8359.(Apr. 12, 2010).

* cited by examiner

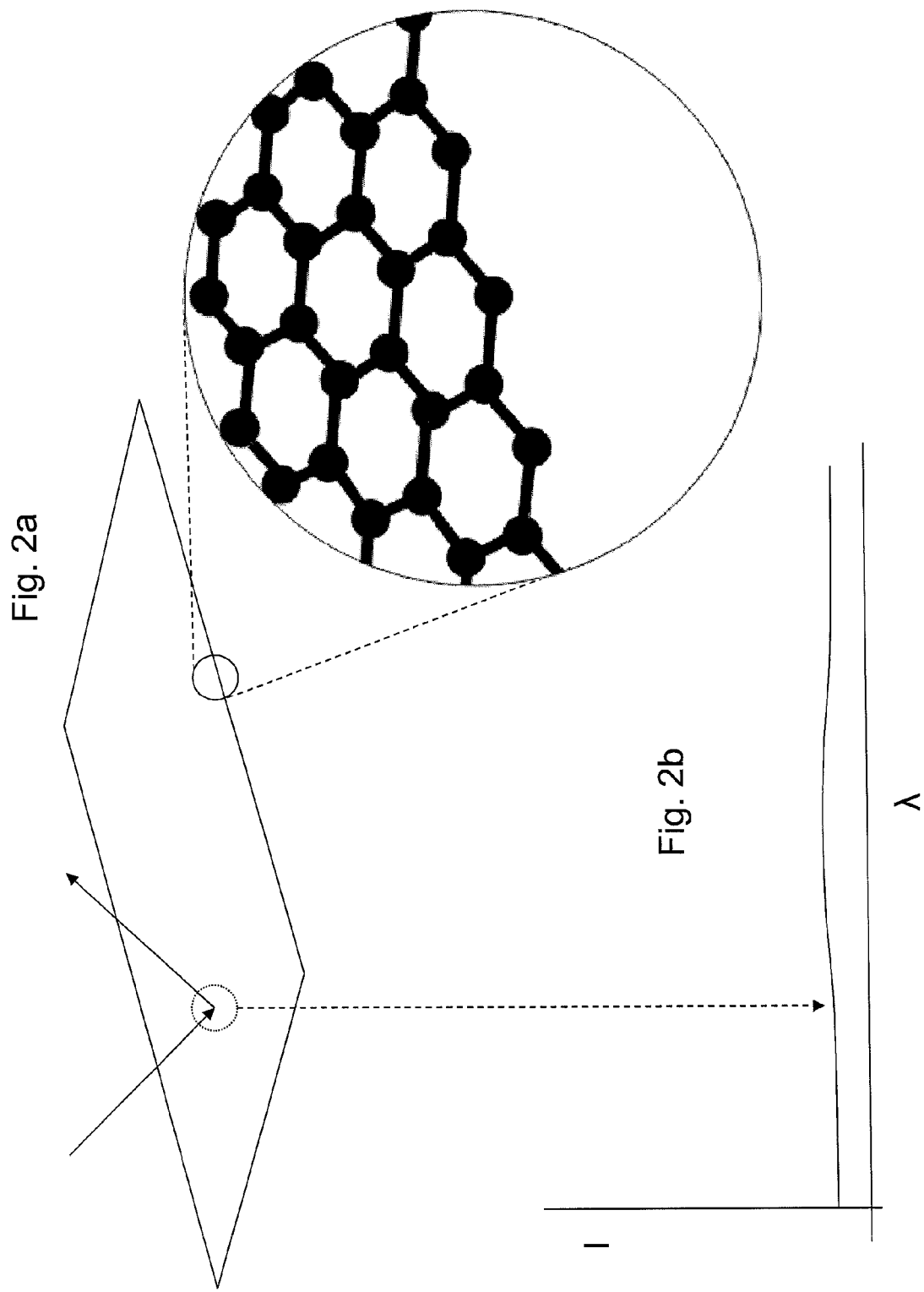

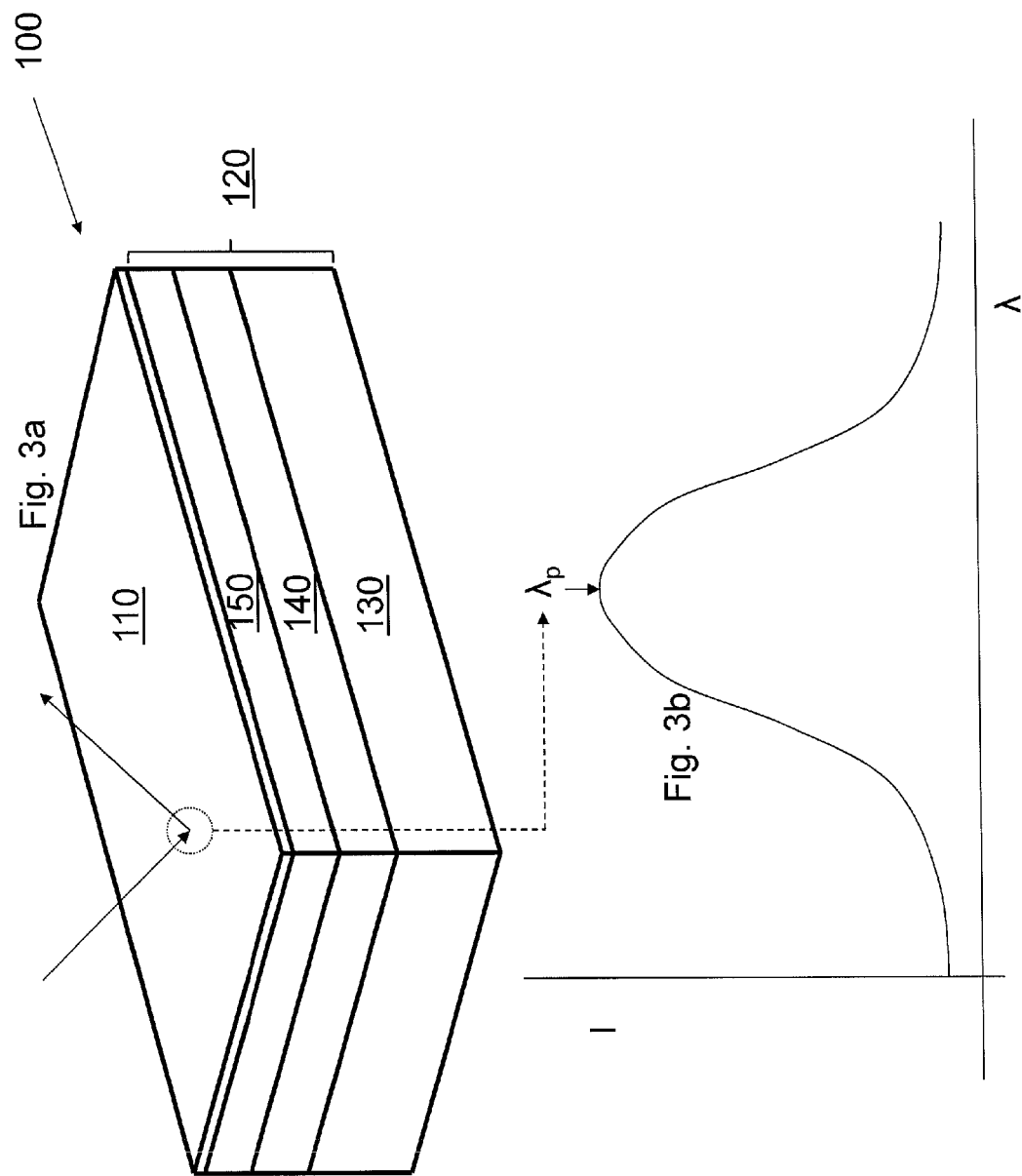

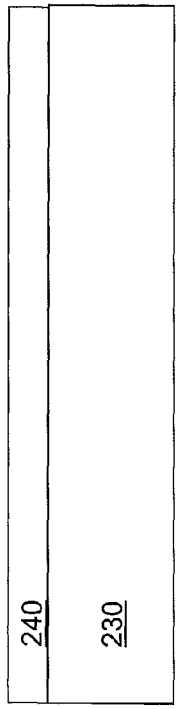
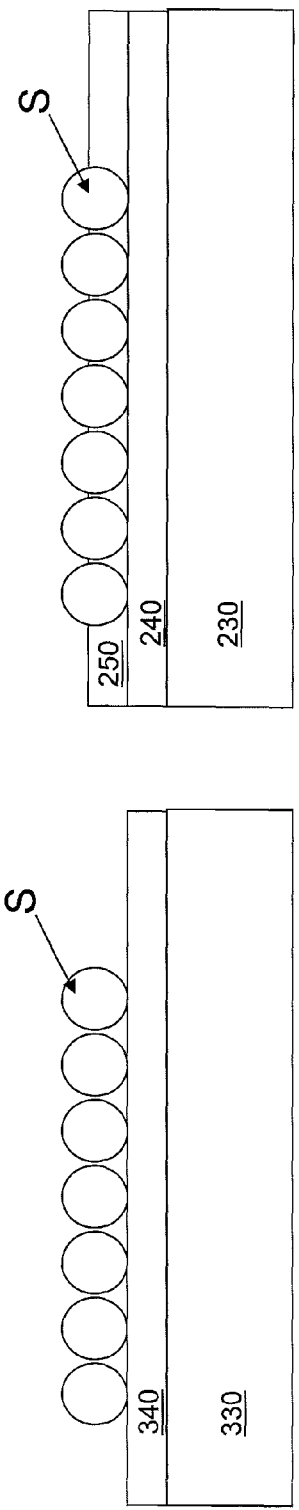
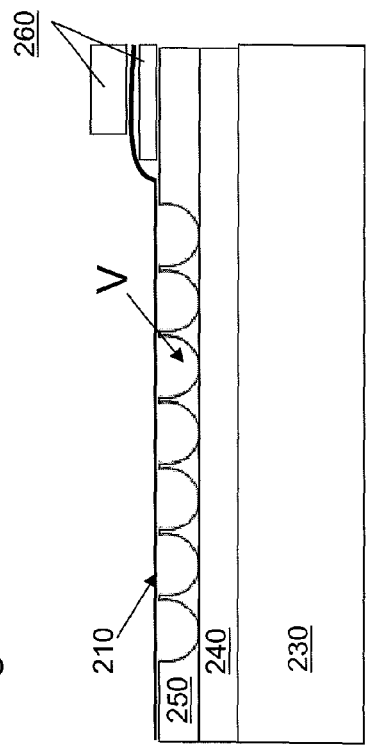
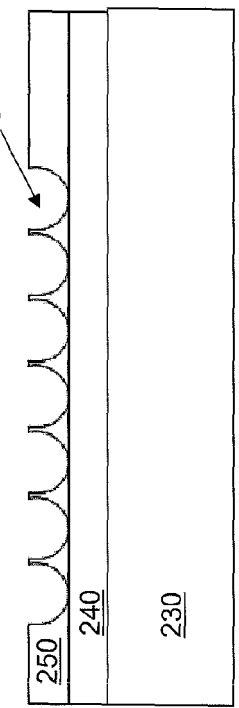
Fig. 4a
Fig. 4b
Fig. 4c
Fig. 4d
Fig. 4e
Fig. 4f

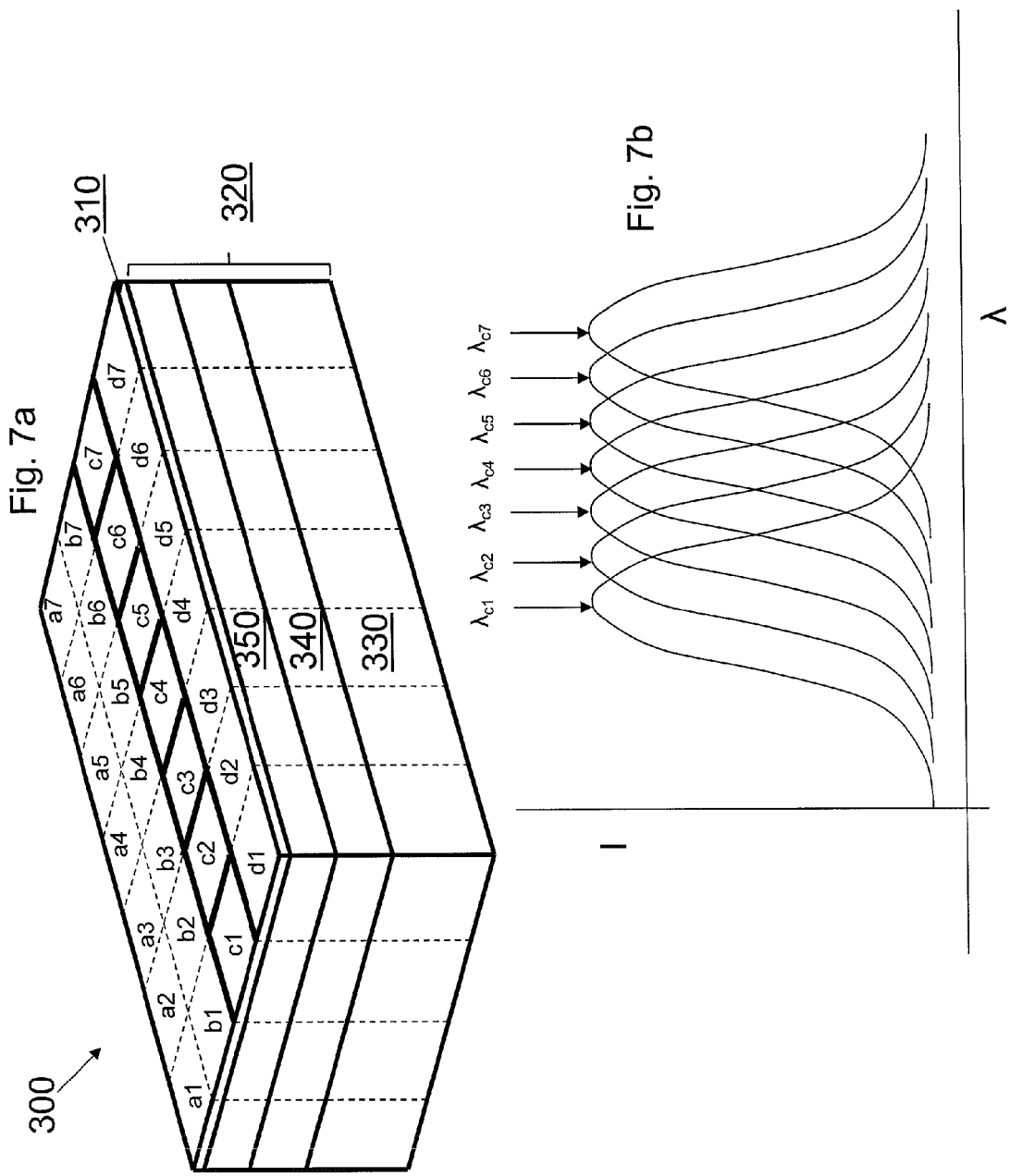

APPARATUS AND ASSOCIATED METHODS RELATED TO DETECTION OF ELECTROMAGNETIC SIGNALLING

CROSS-REFERENCE TO RELATED APPLICATIONS

This patent application claims priority under 35 U.S.C. §119(e) from Provisional Patent Application No. 61/512,137, filed Jul. 27, 20117, the disclosure of which is incorporated by reference herein in its entirety.

TECHNICAL FIELD

The present disclosure relates to the field of apparatus for receiving electromagnetic signalling including nano-scale photo-detectors, associated methods and apparatus.

BACKGROUND

In the future it is believed that there will be a convergence of the physical and the digital worlds and the bridge between these worlds will largely be based on myriad sensor networks. A vast number of sensors are deployed throughout our world already but for true ubiquitous sensing to become a reality, sensors that are fabricated through low-cost and scalable self-assembly processes, while also being competitive in terms of performance, would be helpful.

For future mobile devices, the requirement of low-cost is always an important factor. In addition, the notion of the skin of the mobile devices being sensitive to the environment is attractive and challenging. Intimate contact between the user and their device's 'sensing skin' could provide for a range of features in the areas of healthcare and well-being diagnostics where traditional sensors located in the phone's interior may be unsuitable.

Graphene optoelectronics is also an active field at present, and graphene photodetectors are particularly useful as they have the potential to operate at high frequencies. In addition, the absorption spectrum of graphene is ultra-broadband across the visible and NIR regions.

SUMMARY

In a first aspect, there is provided an apparatus comprising:
a first layer for detecting electromagnetic signalling, wherein the first layer comprises graphene; and
a second layer positioned proximate to the first layer and configured to undergo plasmonic resonance in response to receiving electromagnetic signalling to thereby sensitize the graphene of the first layer to detection of particular spectral characteristics of received electromagnetic signalling corresponding to the particular plasmonic resonance of the second layer.

Particular spectral characteristics may include one or more of:
a particular wavelength of the received electromagnetic signalling, peak wavelength or wavelengths of the received electromagnetic signalling, peak frequency or peak frequencies of the received electromagnetic signalling, null wavelength or wavelengths of the received electromagnetic signalling, null frequency or frequencies of the received electromagnetic signalling, and polarisation of the received electromagnetic signalling.

The second layer may comprise an array of sensitization regions having respective particular characteristic plasmonic resonance parameters to thereby sensitize corresponding respective proximate regions of the first layer to detection of particular respective wavelengths.

The second layer may be configured to undergo plasmonic resonance to sensitize the graphene of the first layer so as to correspondingly modify/affect one or more photo-absorption characteristics of the graphene of the first layer.

The photo-absorption characteristics of the graphene of the first layer may comprise one or more of:
wavelength/frequency selectivity, absorption ratio, and the like.

The absorption ratio of the graphene of the first layer will affect the spectrum of wavelengths/frequencies that are detected by the graphene of the first layer.

The second layer may comprise one or more of:
a nanovoid structure, and a nanoparticle structure.

The second layer may be configured to undergo plasmonic resonance in dependence on one or more resonance parameters of the nanovoid or nanoparticle structure.

The resonance parameters may comprise one or more of:
particle diameter, void diameter, particle spacing, void spacing, density of voids per unit volume, density of particles per unit volume, distribution of particles, distribution of voids, thickness of the nanovoid structure, thickness of the nanoparticle structure, and properties of the materials used in the plasmonic structure(s).

The first layer may be disposed on top of or underneath the second layer with respect to the source of electromagnetic signalling.

The second layer may comprise:
a first sub-layer comprising a dielectric substrate;
a second sub-layer comprising a conductive material, and positioned on the first sub-layer; and
a third sub-layer comprising a plasmonic structure, the third sub-layer being positioned on the second sub-layer, wherein the first, second and third sub-layer arrangement within the second layer is thereby configured to undergo plasmonic resonance in response to receiving electromagnetic signalling to thereby sensitize the graphene of the first layer to detection of particular spectral characteristics of the received electromagnetic signalling corresponding to the particular plasmonic resonance of the second layer.

The apparatus of the first aspect may be one or more of:
an electronic device, a portable electronic device, a module for an electronic device, a module for a portable electronic device, a casing for an electronic device, a casing for a portable electronic device, a casing for a module for an electronic device, and a casing for a module for a portable electronic device.

In another aspect, there is provided an apparatus comprising:
a first layer for detecting electromagnetic signalling, wherein the first layer comprises graphene; and
a second layer positioned proximate to the first layer and configured to undergo plasmonic resonance in response to receiving electromagnetic signalling to thereby sensitize the graphene of the first layer to detection of particular spectral characteristics of received electromagnetic signalling corresponding to the particular plasmonic resonance of the second layer;
wherein the apparatus is one or more of:
an electronic device, a portable electronic device, a module for an electronic device, a module for a portable electronic device, a casing for an electronic device, a casing for a portable electronic device, a casing for a module for an electronic device, and a casing for a module for a portable electronic device.

The casing may comprise or may be a housing for any of the above, or may form part of a housing for any of the above.

In another aspect, there is provided a method comprising:
detecting electromagnetic signalling at a first layer, wherein the first layer comprises graphene that is sensitized to detection of particular spectral characteristics of received electromagnetic signalling corresponding to particular plasmonic resonance of a second layer positioned proximate to the first layer, the second layer being configured to undergo plasmonic resonance in response to receiving said electromagnetic signalling.

In another aspect, there is provided a method, comprising:
providing a first layer for detecting electromagnetic signalling, the first layer comprising graphene; and
positioning a second layer proximate to the first layer, the second layer being configured to undergo plasmonic resonance in response to receiving electromagnetic signalling to thereby sensitize the graphene of the first layer to detection of particular spectral characteristics of received electromagnetic signalling corresponding to the particular plasmonic resonance of the second layer.

In another aspect, there is provided an apparatus comprising:
a means for detecting electromagnetic signalling, wherein the means for receiving electromagnetic signalling comprises graphene; and
a means for undergoing plasmonic resonance, the means for undergoing plasmonic resonance being positioned proximate to the first layer and configured to undergo plasmonic resonance in response to receiving electromagnetic signalling to thereby sensitize the graphene of the means for receiving electromagnetic signalling to detection of particular spectral characteristics of received electromagnetic signalling corresponding to the particular plasmonic resonance of the means for undergoing plasmonic resonance.

In yet another aspect, there is provided a computer program for detecting electromagnetic signalling, the computer program comprising computer program code configured to, when run on a processor, detect the presence of electromagnetic signalling having particular spectral characteristics using a first layer comprising graphene based on received electromagnetic signalling corresponding to particular plasmonic resonance of a second layer positioned proximate to the first layer, the second layer being configured to undergo plasmonic resonance in response to receiving said electromagnetic signalling.

The computer program may be stored on a computer readable medium.

The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

It will be appreciated that where a single "processor" or single "memory" is referred to that this can encompass more than one "processor" or more than one "memory".

Corresponding computer programs for implementing one or more of the methods disclosed are also within the present disclosure and encompassed by one or more of the described embodiments.

The above summary is intended to be merely exemplary and non-limiting.

BRIEF DESCRIPTION OF THE FIGURES

A description is now given, by way of example only, with reference to the accompanying drawings, in which:
FIGS. 2a and 2b show an example of a graphene photodetector layer.
FIGS. 3a and 3b show an embodiment of the present disclosure.
FIGS. 4a-f show a method of fabricating an embodiment.
FIGS. 7a and 7b show another embodiment.

DESCRIPTION OF SPECIFIC ASPECTS/EMBODIMENTS

There are a number of scientific tools that can be used to investigate and examine different substances and chemicals. For example, shining light onto an 'analyte' (substance to be analysed) causes electronic excitation of the electrons in the analyte and through measuring this electronic excitation it is possible to determine information about the substance in question.

As light is composed of electromagnetic signalling/radiation, the varying electric and magnetic fields of the light causes oscillation of the electrons at the surface of the substance in question (at least whilst the light remains shining on the analyte sample). The exact behaviour of the electrons is dependent on the light being shone onto the analyte and also the properties of the surface of the analyte itself.

The oscillation of electrons at the surface of the material can be considered to be quantised into quasi-particles called 'plasmons', and these 'plasmon' quasi-particles can also be observed to oscillate at their own particular wavelength/frequency depending on the properties of the material. The concept behind interpreting electronic oscillations in the surface of a material as 'plasmons' can be likened to the same idea of viewing sound vibrations as 'phonons'. Both phonons and plasmons are abstract quantisations of observable behaviour that make it easier to interpret the physical properties of the system in question, though neither are technically real particles.

Figure 1A:
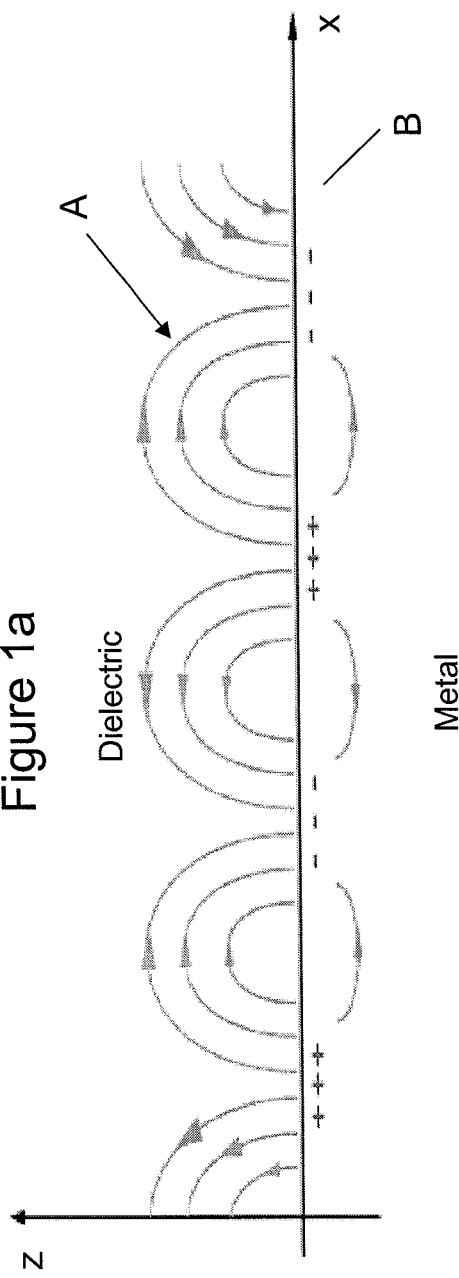
FIGS. 1a and 1b show illustrations of plasmons and plasmonic resonance.

An example of this plasmonic quantisation is shown in FIG. 1a which illustrates how the surface plasmons (SPs—denoted as 'A' in the figure) are surface electromagnetic waves that propagate in a direction parallel to a metal/dielectric interface (denoted as 'B' in the figure).

Figure 1B:
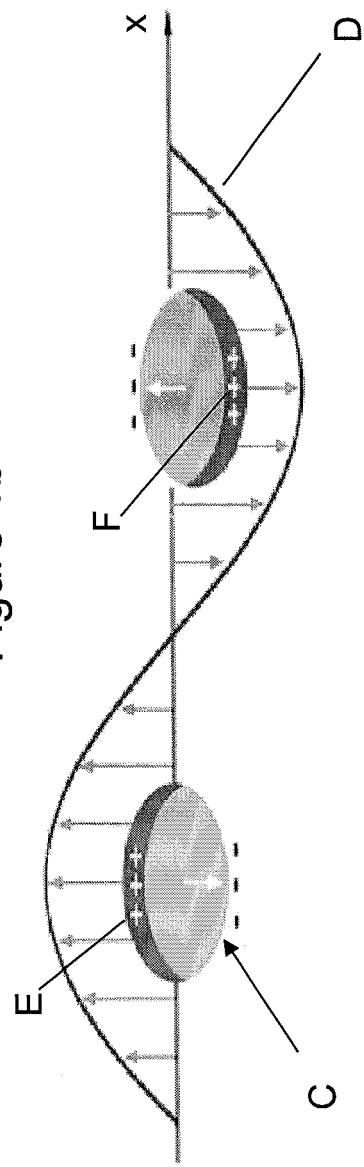

The excitation of the surface of a substance to generate plasmons by electromagnetic signalling/radiation is known as 'surface plasmon resonance' (SPR). FIG. 1b illustrates how plasmon excitation can occur on the surface of a metal sphere C in response to the electric field component E of an incident electromagnetic wave D. This figure shows the excitation and overall displacement of the conduction electron charge cloud F and how this cloud F moves across the surface of the sphere C. The exact behaviour of the movement of surface plasmons across a given body (such as sphere C) can be quite complex, but the explanation of such movement is not the objective of the present disclosure so will not be discussed further.

The nature of the plasmonic resonance that occurs for a given material determines its optical properties. For example, the frequency (or equivalent wavelength) that the plasmonic resonance occurs at determines the plasma frequency of the material. This plasma frequency is like a 'cut-off' frequency for light, where light frequencies below the plasma frequency are reflected, and light frequencies above the plasma frequency are absorbed by/transmitted through the material. For example, gold and copper have a particular plasma frequency in the visible range that the reflected light/electromagnetic radiation collectively gives these materials their characteristically yellow appearance.

It should be noted that while plasmonic resonance will occur at a peak wavelength, the plasmonic resonance effect can produce a spectrum of multiple wavelength peaks (thus being comparatively rich relative to a spectrum with a single wavelength peak) depending on the properties/configuration of the material in question. This has been discussed in more detail below.

This plasmonic resonance phenomenon forms the basis of many standard tools for measuring particular information about the adsorption of material onto metallic surfaces, and is the primary principle behind the operation of a variety of biological sensor applications. For example, surface plasmon resonance (SPR) spectroscopy is a label-free sensing technology that can monitor the thermodynamics and kinetics of biological binding processes, and more generally, real-time changes in the local dielectric environment. It has the potential as a mobile analytical system for the rapid detection of food-borne or environmental pathogens and for health monitoring.

The specific tools that utilise this plasmonic resonance principle of operation typically have some kind of photo-detector/photo-detection layer that receives the electromagnetic signalling associated with plasmons and the corresponding plasmonic resonance of a given sample, and can provide this to a computer for analysis. The material from which the photo-detection layer is formed will affect the sensitivity of the system to plasmonic resonance, and also to which plasmonic resonance frequencies the system is sensitive.

One material that can be useful in this regard is graphene. A photo-detector layer formed of graphene is shown in FIG. 2a. Graphene is a particular configuration of carbon atoms that as a single layer looks very similar to hexagonal chicken wire on the atomic scale. FIG. 2a shows a zoomed-in view of the graphene layer to illustrate its atomic structure. As a material in general, graphene has a wide number of applications and can be rolled or shaped into other structures (e.g. nanotubes/fullerene) or stacked into multiple layers for other purposes, and the like.

Graphene is suitable as a photo-detection layer because it is highly conductive and because it is a relatively broadband material in terms of its frequency sensitivity, i.e. it is not overly sensitive to any one frequency but is relatively sensitive to all frequencies of electromagnetic signalling. FIG. 2b shows a graph (which is intended to be illustrative and not necessarily accurate or to any particular scale) to show the broadband frequency/wavelength response of graphene to incoming electromagnetic signalling. Other physical properties of graphene are that it is light, thin, flexible, transparent, and relatively robust and can therefore reduce size and weight of similar existing devices. Also, graphene is capable of detecting high-frequency electromagnetic radiation/signalling (for example, in the gigahertz frequency range, or equivalent wavelength).

However, a drawback to graphene as a photo-detection layer can be that its overall sensitivity to incident electromagnetic radiation (e.g. from an analyte) is somewhat low (despite its broadband frequency sensitivity). For example, a single layer of graphene typically only absorbs around 3% of incident electromagnetic signalling. This can be a problem for plasmonic resonance sensors as this can yield a poor signal-to-noise ratio, and generally render it less sensitive to plasmonic resonances of a material where those plasmonic resonances have a low magnitude. This poor sensitivity is also illustrated by sketch graph FIG. 2b. The present disclosure attempts to alleviate one or more of the above difficulties that can be encountered through using graphene.

In one or more embodiments described herein, there is provided an apparatus comprising a first layer for detecting electromagnetic signalling, and a second layer positioned proximate to the first layer. The first layer comprises graphene, and the second layer is configured to undergo plasmonic resonance in response to receiving electromagnetic signalling. This plasmonic resonance that the second layer undergoes thereby sensitizes the graphene of the first layer to detection of particular spectral characteristics of received electromagnetic signalling corresponding to the particular plasmonic resonance of the second layer. The particular spectral characteristics may include one or more of: peak wavelength or wavelengths, peak frequency or peak frequencies, null wavelength or wavelengths, and null frequency or frequencies. These characteristics can also be considered to represent particular wavelengths (or equivalent frequencies) or particular wavelength bands within a plasmonic resonance spectrum.

The second layer undergoes plasmonic resonance when excited by electromagnetic signalling incident to the graphene of the first layer, this plasmonic resonance being the same principle as described above. By providing this layer, there is a technical benefit in that the photo-absorption of the graphene of the first layer is enhanced and the wavelength-selectivity of the graphene is increased. In effect, the graphene of the first layer is sensitized to detection of particular spectral characteristics of the received electromagnetic signalling, and the particular spectral characteristics provided by this sensitization are dependent on the nature of the plasmonic resonance that the second layer undergoes.

We will now describe a first embodiment with reference to FIG. 3a.

FIG. 3a illustrates an apparatus 100 according to a first embodiment of the present disclosure. Apparatus 100 comprises a first layer 110 and a second layer 120. The first layer 110 is formed from a single layer of graphene, though the first layer 110 could comprise more than one layer of graphene, or further features in addition to that at least one layer comprising graphene (but not necessarily solely consisting of graphene). For the purposes of describing this embodiment, we shall describe the first layer 110 as if it is composed entirely of one layer of graphene, though other embodiments can comprise more than one layer or layers of other material, or other components as well.

In this example, the second layer 120 is a plasmonic structure that is configured to undergo plasmonic resonance at a particular wavelength in response to electronic excitation. This electronic excitation can occur in response to experiencing electromagnetic signalling coupled electronically to the second layer from another layer (e.g. the first layer), or electromagnetic signalling received directly via electromagnetic radiation. The second layer 120 can be considered to 'catch' electromagnetic signalling that has passed straight through the graphene and has not been detected. The second layer 120 then undergoes plasmonic resonance to provide this stray electromagnetic signalling to the graphene, and the nature of the plasmonic resonance will determine the particular spectral characteristics of the received electromagnetic signalling that the graphene is then sensitized to detect. In any case, whether directly or indirectly, the second layer 120 is a plasmonic structure configured to undergo plasmonic resonance in response to receiving electromagnetic signalling.

The skilled person will appreciate that there are a number of different types of plasmonic structure that can be fabricated, and that each of these different types of plasmonic structure can be fabricated in different ways. For example, a conductive structure comprising a plurality of voids having a diameter on the order of nanometers spread throughout can define a plasmonic nanovoid structure that will undergo plasmonic resonance in response to electronic excitation. Similarly, a non-conductive structure comprising a plurality of conductive nanoparticles spread throughout can define a plasmonic nanoparticle structure that will also undergo plasmonic resonance in response to electronic excitation. Other plasmonic structures are of course possible and also within the scope of the present disclosure.

In this particular embodiment, the second layer 120 is a nanovoid plasmonic structure and its fabrication is discussed briefly here, and in more detail below (with reference to FIG. 5). In this embodiment, the second layer 120 is composed of first, second and third sub-layers 130, 140, 150. The first sub-layer 130 is formed from a dielectric substrate. In this example, the first sub-layer 130 is a silicon wafer that is coated with a layer of thermally-grown silicon oxide (50-300 nm thick, for example). This provides a high quality dielectric substrate, though other materials are also possible as dielectric substrates.

As has been mentioned above, plasmonic structures like nanovoid structures have particular absorption spectra, such that they have a peak at a particular wavelength corresponding to its particular plasmonic resonance. It will therefore act to sensitize the graphene to detect EM signals maximally at this plasmonic resonance wavelength but also at other wavelengths depending on the exact absorption spectra. This will therefore sensitize the first layer 110 to particular spectral characteristics of the received electromagnetic signalling corresponding to the particular plasmonic resonance of the second layer 120.

The spectral characteristics will be characteristics that can include one or more of: peak wavelength or wavelengths, peak frequency or peak frequencies, null wavelength or wavelengths, and null frequency or frequencies. In certain conditions polarisation of the received electromagnetic signalling may also constitute a spectral characteristic (discussed in more detail below).

The second and third sub-layers 140, 150 are conductive (e.g. metallic) and in this example are both formed from gold (Au) but may also be formed of silver (Ag), platinum (Pt), aluminium (Al). The second sub-layer 140 can also be an indium tin-oxide layer (ITO) though the third sub-layer 150 is not necessarily formed from ITO. In this example, the second sub-layer 140 is conductive to allow for the electro-deposition of the plasmonically-active third sub-layer 150. As a result, it will be appreciated that in embodiments where the third sub-layer 150 is not to be formed via electro-deposition that the second sub-layer 140 can be omitted (not shown). In this example there are structural differences between the second and third sub-layers 140, 150, which are described below. Now, it will become apparent that other embodiments may omit one or more of these layers, or comprise additional layers.

The second sub-layer 140 is deposited on the top surface of the first sub-layer 130 by using a thin-film vapour-phase technique (or other techniques such as sputtering or thermal or electron-beam evaporation). The third sub-layer is also to be formed by electro-deposition on the top surface of the second sub-layer 140, but is fabricated so as to be provided with a plurality of voids that are on the nano-scale (e.g. on the order of 100s of nm). These are spaced so as to form nano-scale-sized 'bubbles' throughout the third sub-layer. The structure of this third sub-layer 150 can be likened to a metallic sponge. These 'bubbles' define 'nanovoids' throughout the third sub-layer 150. Electro-deposition is also just one example of how the second 120 can be formed. Electroplating and adhesion using appropriately conductive (or non-conductive) materials are also within the scope of the present disclosure as are other fabrication methods known in the art.

In this example, these nanovoids are formed by distributing an array of polystyrene spheres (or other volume shapes) on the second sub-layer 140 after deposition onto the first sub-layer 130, followed by electro-deposition of the third sub-layer 150 onto the second sub-layer 140 and between the gaps of the polystyrene spheres. The spheres are then removed (e.g. by a solvent) so that the third sub-layer 150 comprises an array of voids where the spheres were originally present.

In a variation (not shown) of this example, a fourth sub-layer is provided on top of the second sub-layer. This fourth sub-layer is a non-structured layer that the third sub-layer is to be formed on and from, so that the fourth sub-layer could then be used to act as a 'seed' layer to cause crystal growth of the third sub-layer, or as a further intermediate layer to promote the adhesion of the fourth sub-layer.

In this embodiment, the apparatus 100 is made by the second layer 120 being positioned proximate to the first layer 110 by way of the first layer 110 being affixed to the top surface of the second layer 120, which in this example is the third sub-layer 150. In this way, the second layer 120 and first layer 110 abut one another and are affixed to one another such that the underside of the first layer 110 is affixed to the top-most surface of the second layer (the third sub-layer 150). In another embodiment, a physical dielectric spacer layer (not shown) is provided between the first and second layers 110, 120 to electrically isolate the two layers from one another. Nevertheless, it is the proximity of the first and second layers 110, 120 permits the second layer 120 to experience electronic excitation and undergo plasmonic resonance in response to the first layer 110 receiving electromagnetic signalling.

As has been discussed above, when electromagnetic signalling is received at the top surface of a substance like metal, plasmonic resonance occurs. This requires that the electromagnetic signalling contains specific wavelengths/frequencies that match up with the wavelengths/frequencies that elicit plasmonic resonance in the material in question, i.e. the wavelengths/frequencies of the electromagnetic signalling must be co-incident with the plasma frequency of the material in question. This plasmonic resonance occurs at a specific frequency—the plasma frequency of the material in question. In the case of this apparatus 100, electromagnetic signalling is received by the first layer 110, and the second layer 120 is induced into plasmonic resonance by virtue of the metallic sub-layers 140, 150 that are in proximity with the first layer 110. In effect, the second layer 120 acts as a plasmonic structure that affects the operation of the first layer 110.

When plasmonic resonance occurs in a layer (i.e. like second layer 120) proximate to the graphene of the first layer 110 this causes:

1) Enhancement of the magnitude of the electric field in the vicinity of the graphene and thus an enhancement in the electric energy able to excite photo-generated carriers within the graphene; and 2) Reflection or scattering of the otherwise wasted light that has transmitted through the graphene, this reflected or scattered light may have another chance to excite photo-generated carriers within the graphene.

The exact diameter/size, spacing and relative density of the nanovoids per unit volume within the third sub-layer 150 directly affects the plasmonic resonance of the top-surface of the second layer 120. This is because localised surface plasmons (LSPs) occur rather than bulk surface plasmons as per FIG. 1. These LSPs are charge density oscillations that are confined a particular location because of the nanovoid structure of the third-sub layer 150.

In an alternative example, the third sub-layer 150 is not conductive but insulative, and the nanovoids provided in the third sub-layer 150 are instead conductive/metallic nanoparticles. This provides a similar effect to that nanovoid structure described above, but can be considered to be the structural inverse of the nanovoid structure (i.e. a nanoparticle structure comprises a non-conductive volume layer having conductive nano-scale volumes spread throughout; a nanovoid structure comprises a conductive volume layer having non-conductive nano-scale volumes spread throughout). In any case, excitation of LSPs by electromagnetic radiation results in strong light scattering, the appearance of intense SP absorption bands, and an enhancement of the local electromagnetic fields.

This enhancement of local electromagnetic fields in close proximity to the graphene of the first layer 110 enhances the overall sensitivity of the first layer 110 to electromagnetic signalling. In addition, the second layer 120 will, by virtue of the plasmonic structure in the third sub-layer in this example, undergo plasmonic resonance at a particular wavelength. Therefore, the enhancement of the sensitivity of the first layer 110 will be emphasised at a particular wavelength/frequency that corresponds to the plasmonic resonance that the second layer 120 experiences. In summary, what this means is that by providing a second layer 120 that is configured to undergo plasmonic resonance in response to the graphene of the first layer 110 receiving electromagnetic signalling, it is possible to sensitize the graphene of the first layer 110 to detection of a particular wavelength that corresponds to the particular plasmonic resonance of the second layer 120.

This is schematically illustrated in FIG. 3b. Electromagnetic signalling/radiation is shone onto the first layer 110 of the apparatus 100. This can be received from an analyte that is positioned proximate to the first layer 110, but the operation of this apparatus 100 is not necessarily limited thereto. It should be pointed out that the optical spectra of such plasmonic structures can have a rich set of spectral features and are rarely simply a single peak at the resonance wavelength. A simple single peak type graph has been shown, but should not be considered as limiting.

The electromagnetic signalling causes electronic excitation not just of the first layer 110 having the graphene, but also in the proximate second layer 120, as any electromagnetic signalling that passes through the first layer 110 is received by the second layer 120. This received electromagnetic signalling causes the second layer 120 to undergo plasmonic resonance. The exact nature of the particular plasmonic resonance of the second layer 120 is determined by the configuration of the plasmonic structure (in this case, the configuration of the third sub-layer 150). In turn, the electronic excitation and plasmonic resonance of the second layer 120 affects the sensitivity of the first layer 110.

Specifically, the electromagnetic fields generated by the localised plasmonic resonance of the second layer 120 occurring in proximity to the first layer 110 enhances the first layer's 110 sensitivity to particular spectral characteristics (e.g. a particular wavelength) that corresponds to the particular plasmonic resonance of the second layer 120. As a result, the first layer 110 is made to be far more sensitive than in isolation, and also to be sensitive to a particular wavelength/frequency or the like (as per the spectral characteristics) rather than being non-specific.

This means that when a graphene photo-detection layer receives electromagnetic signalling (e.g. provided by an analyte) then the electronic excitation the graphene layer undergoes and that is outputted (e.g. by way of an electrical output contact [not shown] to a computer or electronic device) for further analysis can be enhanced in terms of amplitude of the output signalling and also sensitized to a particular wavelength.

For example, in an example where the apparatus is used to sense an analyte that has been adsorbed at the surface of the apparatus, the adsorbed analyte can affect the local dielectric environment of the device and can therefore have an effect on the conditions determining the behaviour of the plasmonic resonance. For example, the effect of the analyte could exaggerate or diminish the effect of the electromagnetic signalling at the graphene layer at some frequencies, and therefore affect the rate of generation of photo-carriers in the graphene. In such examples, this change to the response of the apparatus would manifest itself as a change in the photocurrent which can be outputted.

In summary, providing a plasmonic structure with a graphene photo-detection layer allows sensitizing of a first layer having graphene to provide an enhanced and more sensitive photo-detection apparatus (100) than is presently provided. Making the first layer 110 out of graphene can allow for much smaller, lighter and robust photo-detection apparatus that can be provided as part of electronic devices, portable electronic devices, modules for these, or casings/housings for any of these (modules or devices), while the plasmonic structure allows for specific tuning and enhancing of the functionality of such graphene layers.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

We will now describe a method of fabrication of apparatus 100 in more detail with reference to FIGS. 4a-f. It should be noted that this is just one way of manufacturing one or more embodiments of the present disclosure, and that there are other alternatives available to a skilled person to this method described below in order to arrive at one or more of the embodiments described herein.

FIG. 4a shows a first sub-layer 230. This, like in FIG. 3a, is a dielectric substrate (such as a thermally-oxidised silicon wafer, or the like). This is dimensioned according to a particular size apparatus 200 that may be required by a designer/user.

FIG. 4b shows that a second sub-layer 240 has been electrodeposited onto the first sub-layer. This is a metallic conductive layer formed from metals such as gold, or silver, etc.

FIG. 4c shows that an array of polystyrene spheres S have been disposed on top of the second sub-layer 240. These are on the nano-scale and 300 nm in diameter in this embodiment, though other diameters are possible. The positioning of these spheres S determines the voids V that will be left in the nanovoid structure later and therefore will also determine the plasmonic resonance and sensitivity of the apparatus to a particular wavelength, so the spheres S can be configured, arranged and positioned according to the structure desired by a particular designer/user. The arrangement in this example is a Hexagonal Close-Packed (HCP) configuration that is one layer deep.

FIG. 4d shows that a third sub-layer 250 has been electrodeposited onto the second layer to fill any volume not already occupied by the spheres S to a given depth. In this example the tops of the spheres S protrude beyond the top of the third sub-layer 250 but this need not be the case in other examples (not shown).

FIG. 4e shows that the polystyrene spheres S have been removed (e.g. by an acid, or other solvents like tetra-hydrofuran (THF) or toluene, or the like) to leave behind defined voids V. It will be appreciated that other materials can be used for the spheres S, and that still other geometric volumes can be used instead of 'spherical' volumes.

The voids V collectively define the respective sub-layers 230, 240, 250 as forming a second layer 220 configured to undergo plasmonic resonance at a particular wavelength based on the exact configuration of the voids V. In an alternative (not shown), the third sub-layer 250 is actually a non-conductive material (such as a polymeric or elastomeric material) within which are disposed conductive nanoparticles. As discussed above, this nanoparticle plasmonic structure operates in a similar way to the nanovoid structure, but can be considered to be the structural 'inverse' of the nanovoid structure. In the same way as the fabrication process for the nanovoid structure example of FIGS. 4a-4f, the nanoparticle alternative can be made by disposing the third sub-layer of elastomeric material (or the like) onto the second sub-layer and arranging conductive nanoparticles throughout (though these nanoparticles would not be etched away).

Figure 6:
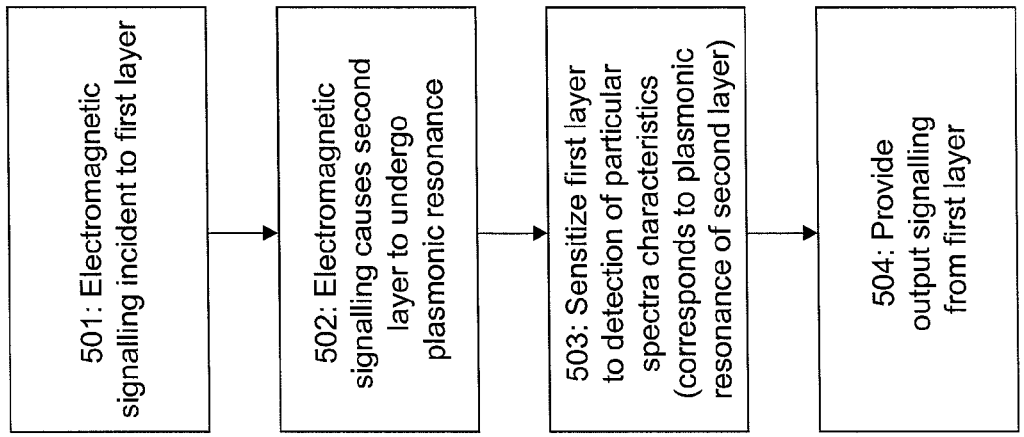
FIG. 6 shows a flowchart for fabricating an embodiment.

FIG. 4f shows the final step of fabrication where a graphene first layer 210 and output contact 260 is provided on the top of the second layer 220 (with a dielectric spacing layer [not shown] provided therebetween to provide for electrical isolation, while still permitting electronic interaction between the first layer 210 and second layer 220). This allows for reception of electromagnetic signalling, and output of generated signalling via the electrical output contact 260. In the case where a first layer 210 is provided already, the method can be summarised by FIG. 6, which shows step 401 of providing a first layer comprising graphene, and step 402 which comprises positioning the second layer 220 (configured to undergo plasmonic resonance as described above) proximate to the first layer 210.

In addition, the position of the maximum electric field associated with the plasmonic resonance of the nanovoid structure of the second layer 220 can also be determined as a function of the geometry and material of the nanovoid structure. This is therefore another option for the detection of particular spectral characteristics of electromagnetic signalling by the first layer 210.

In this example, it should be noted that the second layer 220 can be considered to be anisotropic insofar as it is two-dimensional. It will also be appreciated that, if the sphere (and therefore the resultant nanovoid) ordering is perfect, then there will be a six-fold symmetry in the sphere packing (hcp) and this will mean that the spectral response of the second layer can be dependent on the particular polarisation of the incident light. Therefore the sensitization of the graphene of the first layer to detection of particular spectral characteristics of received electromagnetic signalling can include sensitization to the particular spectral characteristic of polarisation in such circumstances. Other variations will also be appreciated by the skilled person and are within the scope of the present disclosure.

There are specific configurations that can be formed using the method of FIGS. 4a-4f uses spheres/voids that are hexagonally close-packed to a first order approximation. For example, from the paper 'Faraday Discussions', 2004, 125, 117:

1) Sphere diameter: 700 nm;
   Centre-centre spacing: ~700 nm;
   Layer thickness: 573 nm (which gives an absorption peak around 535 nm);
   Layer material: Gold
2) Sphere diameter: 700 nm;
   Centre-centre spacing: ~700 nm;
   Layer thickness: 245 nm (which gives absorption peak around 520 nm);
   Layer material: Platinum.

It will be appreciated that the absorption spectra provided by the plasmonic resonance of the second layer 120/220 can be made to be very simple, or very complex, or anywhere in-between depending on the physical configuration, void/particle distribution, material choices, geometry, thickness, etc. It is possible to provide complex absorption spectra that are substantially more intricate/rich than single peak spectra, and these can be useable in various different applications to sensitize a single apparatus to multiple peak wavelengths according to specific peaks of the plasmonic resonance of the second layer 120/220.

Figure 5:
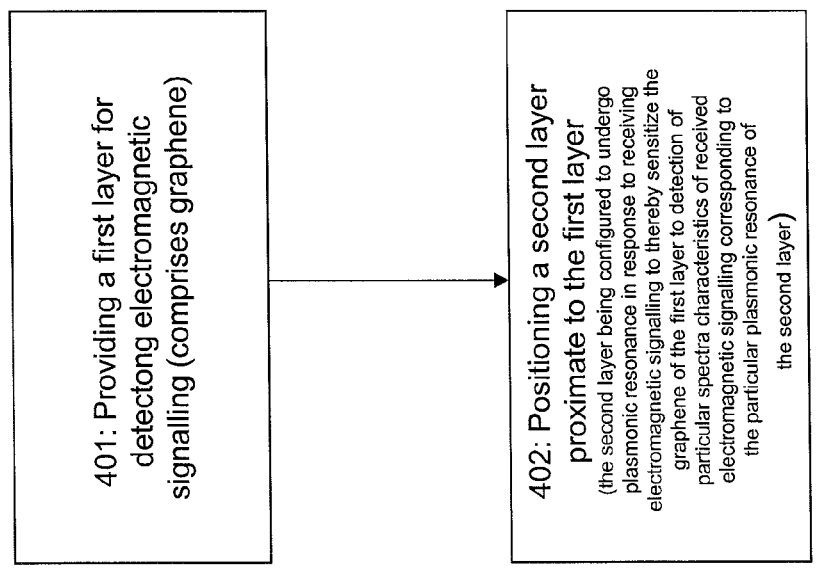
FIG. 5 shows a flowchart for fabricating an embodiment.

We will now describe a method of operation with reference to FIG. 5 of the fabricated apparatus 200 as illustrated in FIGS. 4a-f.

Step 501: Electromagnetic signalling is received by the apparatus (inclusive of the first layer 210 and the second layer 220). Typically, greater than 97% of the light will initially be transmitted through the graphene of the first layer 210 and so a proportion of this electromagnetic signalling will therefore be received by the second layer 220 that is underneath the first layer 210.

Step 502: The second layer 220 is caused to undergo plasmonic resonance in response to this received electromagnetic signalling. As has been discussed above, the exact plasmonic resonance is dependent on the configuration of the second layer 220 (in particular, the nanovoids/nanoparticles of the second layer 220). It will be appreciated that, at least functionally, the apparatus 100 would still function and sensitize the first layer 110/120 accordingly if the second layer 120/220 only comprised the third sub-layer 150/250. As such, within the scope of the present disclosure (not shown) are embodiments that do not comprise the first or second sub-layers 130/230, 140/240.

Step 503: The plasmonic resonance that the second layer 220 undergoes directly affects the operation of the first layer 210 and causes the first layer 210 to be sensitized to detection of particular spectral characteristics (based on that plasmonic resonance behaviour). This can involve sensitizing detection to a particular wavelength or sensitizing detection in order to absorb more light in a broadband way depending on the particular absorption spectra of the plasmonic layer. This is in accordance with the particular plasmonic resonance that is experienced by the second layer 220.

Step 504: The first layer 210 provides an output based on the received signalling and the plasmonic resonance experienced by the second layer 220.

In the above apparatus, method of fabrication and method of operation, the second layer 120/220 is configured such that the apparatus is only sensitized to one particular wavelength (because of the particular properties/distribution of the nanoparticles/nanovoids in particular). As has been mentioned, it is possible that a single layer 120/220 can be configured to have a number of distinct peak wavelengths to thereby sensitize the apparatus to several wavelengths simultaneously (depending on the absorption spectra of the second layer 120/220).

Methods of placement of spheres to provide nanovoid structures as per the abovedescribed method are well understood in the art by skilled persons. Similarly, a skilled person would appreciate how it would be possible to provide such particular nanoparticle structures via other methods to provide plasmonic structures with particular defined resonance parameters. For example, lithographic techniques are well known and can be used to define arrays of plasmonic structures with particular geometric arrangements. Similarly, self-assembled structures can be used, which provide for a cheaper way of producing such plasmonic structures. In addition, well-ordered metallic nanoparticle arrays can be used.

We will now describe another example in which an apparatus 200 is provided with distinct sensitization regions to allow for sensitization of different proximate regions of the first layer to different wavelengths. We will now describe this second embodiment with reference to FIGS. 7a and 7b.

In this further embodiment, the apparatus 300 is identical to that of apparatus 100 in FIG. 3a, except that the third sub-layer 350 (of the second layer 320) has a plurality of different sensitization regions a1-d7 that are distinct from one another by virtue of the nanovoid arrangement in that region. The dashed lines in FIG. 7a denote these particular regions a1-d7. A general overview of these sensitization regions is that these sensitization regions can be likened to individual sub-regions that each have their own particular plasmonic resonance that they will undergo in response to electronic excitation, which thereby sensitizes the corresponding proximate region of the first layer 310. The nature of what is meant by 'sensitization region' will become apparent in the further discussion of this embodiment.

As has already been discussed above, the fabrication of nanovoids within the third sub-layer 150 can be performed by arranging an array of polystyrene spheres on the second sub-layer 140 during manufacture prior to depositing the third sub-layer 150, then the spheres can be removed to provide nanovoids throughout the third sub-layer 150.

The same fabrication process can be used in this embodiment to provide a number of different sensitization regions which can be likened to 'pixels'. In this example, the second layer 340 is to be divided up so as to define an array of individual regions (denoted a1-d7 in this example for ease of explanation). This is achieved during the fabrication process, within which the spheres are arranged in such a way that the layout and configuration of the spheres within each region are to be different to one another.

Alternatively, the layout and configuration of the spheres could be uniform across all pixels in other embodiments. Different pixel contact regions (not shown) can be defined such that each pixel can be individually addressed electrically (e.g. via second sub-layer 340) during fabrication such that different types of metal can be used and built up for different regions/pixels and/or the thickness of the third sub-layer 350 can be different for different regions/pixels.

In addition, the layout and configuration could be uniform across all pixels in other embodiments, e.g. by using different types of metal or layer thickness for the second layer 320.

Different pixel contact regions (not shown) can also be defined such that each pixel can be individually addressed electrically so that each pixel/region can provide its own respective output signalling (e.g. via second sub-layer 340) during receipt and detection of electromagnetic signalling.

For example, region a1 can be provided with a closely packed (e.g. hexagonal close packed) matrix of spheres that are 300 nm in diameter and only one layer deep, while region a2 can be provided with exactly the same arrangement but with spheres of 350 nm diameter. Still further, b1 could be provided with the same diameter spheres as a1 but a different close packed arrangement (e.g. Cube Close-Packed—CCP) and b2 could be a CCP version of the sphere arrangement in a2, and so on so forth. What this means is that as each region is configured differently, each region will undergo different particular plasmonic resonance (e.g. region a1 will undergo plasmonic resonance at $\lambda_{a1}$ and region a2 will undergo plasmonic resonance at a different wavelength $\lambda_{a2}$). Different regions can be provided or defined using the similar or different sphere diameters, arrangements, and spacings. These contribute towards different resonance parameters and affect the overall distribution and density of the nanovoids per unit volume of the second layer. Additionally, properties like the conductivity of the material used to fabricate the second layer 320 and its sub-layers can affect the resonance of the second layer 320. Similarly, differing nanoparticle regions can be provided (e.g. joining together sub-regions of differently distributed nanoparticles) to define an array of sensitization regions.

As per the principle of operation described in relation to apparatus 100, this means that each corresponding respective proximate region of the first layer 310 will be sensitized according to particular plasmonic resonance of the corresponding respective proximate region of the second layer 320. This means that a single layer (first layer 310) can be configured by way of a single plasmonic structure (second layer 320) to have enhanced sensitivity to a plurality of different wavelengths (as illustrated in FIG. 7b). Each of the 'cells' or 'pixels' that are defined by the separate sensitization regions can have their own electrical output contact (not shown) to allow for direct onward transmission of their signalling to a device (like a computer or processor) for further analysis and processing, or even just displaying of the output signalling. These cells/pixels can also be individually addressed by a control device (see FIG. 8 described below).

For example, a graphene photo-detector can be operated in a two terminal configuration (two terminal contacts in direct electrical contact with the graphene of the first layer 310) or a three-terminal configuration (this configuration has an additional 'gate' electrode that is electrically-isolated from the graphene of the first layer 310). The three-terminal configuration can provide more freedom to optimise the photo-detection response/particular spectral response of the apparatus 300.

In another variation the first layer 310 comprises a gate electrode (not shown) that is uniform across the graphene of the first layer 310 and is separated by a dielectric spacer (not shown). The source and drain electrodes (the remaining two terminal contacts—not shown) can be provided by, for example, an inter-digitated (IDT) electrode array.

Various options are possible for the contact geometry of the second layer 320 to provide for separate output paths for each pixel, for example:
1) Each pixel can have an IDT electrode array on top with the second sub-layer 340 being a gate electrode if isolated from the graphene of the first layer 310.

2) Each pixel can be connected in a two-terminal way with an IDT electrode on top of the graphene of the first layer 310 or a single electrode on top of the graphene of the first layer 310, and the second contact would be provided as part of the second layer 320. Depending on the configuration, care may be required during fabrication to ensure that the two contacts do not short each other out.

In one or more embodiments, each pixel can be considered to be a graphene 'flake' that is isolated from adjacent pixels. For example, a single continuous layer of graphene could be deposited over all the pixels and an additional graphene etch step (e.g. using patterned oxygen plasma etching) can then be used. This can help to reduce or eliminate crosstalk between the pixels.

The above principles thereby allow for the fabrication of an apparatus (e.g. apparatus 300) that has enhanced sensitivity to a variety of different wavelengths using the same fabrication process as that shown in FIGS. 4a-4f.

In this example different distributions of nanovoids are used to achieve the different sensitization regions, but equivalent nanoparticle arrangements can also be used to achieve a similar result. For example, a plurality of separate nanoparticle structures with different nanoparticle distributions could be formed then joined together to define an array of sensitization regions. In another variation, close-packed nanoparticle mono-layers can be provided via micro-contact printing.

Figure 8:
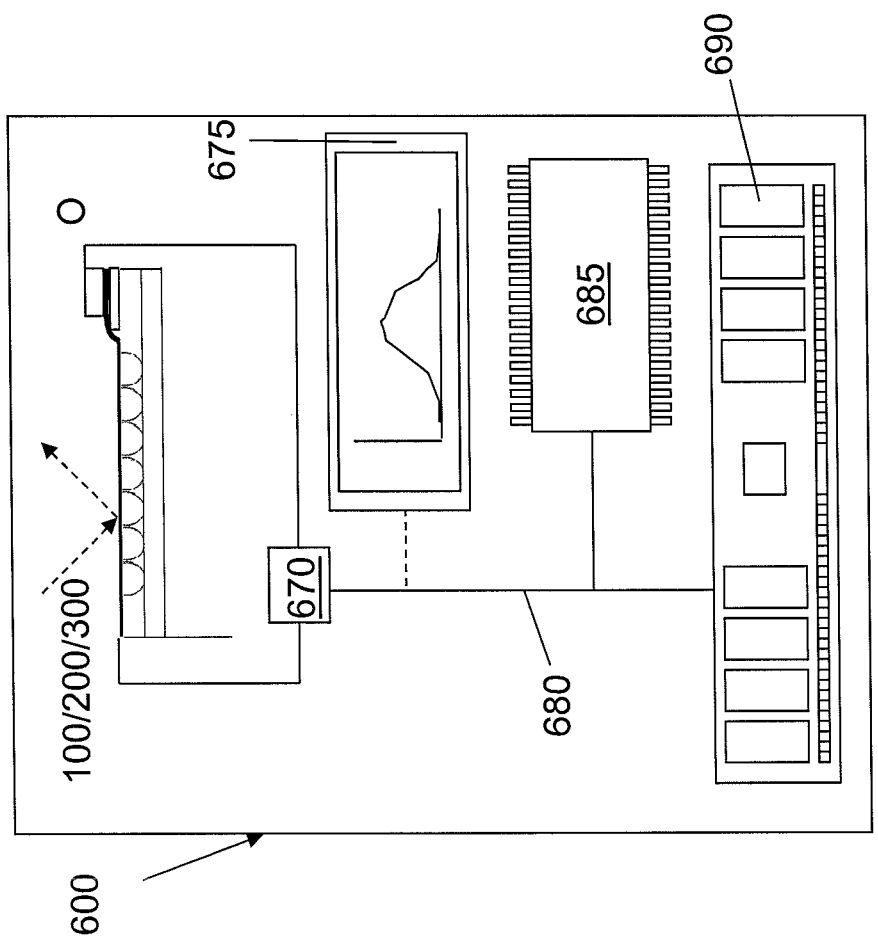
FIG. 8 shows a further embodiment.

FIG. 8 illustrates how the various embodiments described above can be implemented in an electronic device 600. FIG. 8 illustrates schematically a device 600 (such as a portable mobile telephone) comprising the apparatus 100/200/300 as per any of the embodiments described above.

The device 600 may be an electronic device (including a tablet personal computer), a portable electronic device, a portable telecommunications device, or a module for any of the aforementioned devices. The apparatus 100/200/300 can be provided as a module for such a device 600, or even as a processor for the device 600 or a processor for a module for such a device 600. The device 600 also comprises a processor 685 and a storage medium 690, which are electrically connected to one another by a data bus 680.

The apparatus 100/200/300 is first electrically connected to an input/output interface 670 that receives the output generated by the apparatus 100/200/300 and transmits this onwards to the rest of the device 600 via data bus 680. Interface 670 can be connected via the data bus 680 to a display 675 (touch-sensitive or otherwise) that provides information from the apparatus 100/200/300 to a user. Display 675 can be part of the device 600 or can be separate.

The device 600 also comprises a processor 685 that is configured for general control of the apparatus 100/200/300 as well as the rest of the device 600 by providing signalling to, and receiving signalling from, the other device components to manage their operation.

The storage medium 690 is configured to store computer code configured to perform, control or enable the making and/or operation of the apparatus 100/200/300. The storage medium 690 may also be configured to store settings for the other device components. The processor 685 may access the storage medium 690 to retrieve the component settings in order to manage the operation of the other device components. The storage medium 690 may be a temporary storage medium such as a volatile random access memory. On the other hand, the storage medium 690 may be a permanent storage medium such as a hard disk drive, a flash memory, or a non-volatile random access memory.

Figure 9:
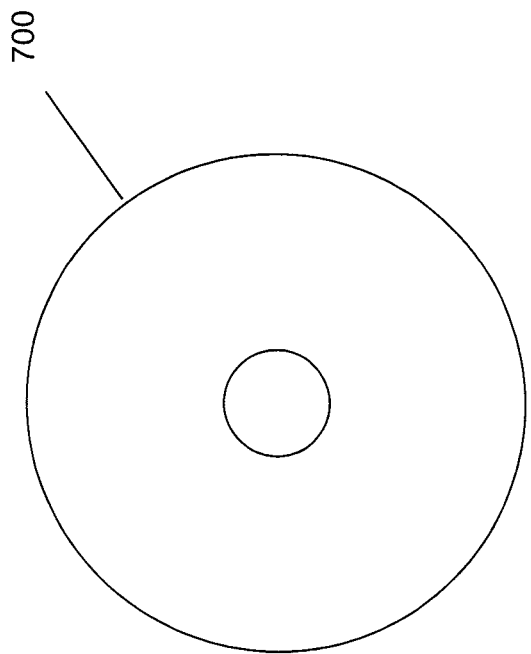
FIG. 9 shows a computer readable medium.

FIG. 9 illustrates schematically a computer/processor readable media 700 providing a program according to an embodiment of the present invention. In this example, the computer/processor readable media is a disc such as a digital versatile disc (DVD) or a compact disc (CD). In other embodiments, the computer readable media may be any media that has been programmed in such a way as to carry out an inventive function. For example, the computer readable media 700 can comprise a computer program that, when executed on processor, receives output signalling from the apparatus 100/200/300 and presents the output signalling as a graphically represented output on the display 675.

One or more aspects/embodiments described herein relate to portable electronic devices, such as hand-portable electronic devices (which may be hand-held in use, can be placed in a cradle in use, and the like) such as Personal Digital Assistants (PDAs), mobile radio-telephones, tablet computers, and the like.

Such portable electronic devices can also provide one or more functions such as: audio/text/video communication functions (e.g. tele-communication, video-communication, and/or text transmission (Short Message Service (SMS)/Multimedia Message Service (MMS)/emailing) functions), interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
   a first layer for detecting electromagnetic signalling, wherein the first layer comprises graphene; and
   a second layer positioned proximate to the first layer and configured to undergo plasmonic resonance in response to receiving electromagnetic signaling, the second layer comprising two or more sub-layers, at least one of which is a conductive material;
   wherein the graphene of the first layer is sensitized to detection of particular spectral characteristics of received electromagnetic signalling corresponding to the particular plasmonic resonance of the second layer at at least one plasmonic structure in the second layer, wherein at least one of the size, spacing, and density of the plasmonic structure is controllable for specific tuning and enhancing of a functionality of the graphene of the first layer.

2. The apparatus of claim 1, wherein the particular spectral characteristics comprises one or more of:
   a particular wavelength of the received electromagnetic signalling, peak wavelength or wavelengths of the received electromagnetic signalling, peak frequency or peak frequencies of the received electromagnetic signalling, null wavelength or wavelengths of the received electromagnetic signalling, null frequency or frequencies of the received electromagnetic signalling, and polarisation of the received electromagnetic signalling.

3. The apparatus of claim 1, wherein the second layer comprises an array of sensitization regions having respective particular characteristic plasmonic resonance parameters to thereby sensitize corresponding respective proximate regions of the first layer to detection of particular respective wavelengths.

4. The apparatus of claim 1, wherein the second layer is configured to undergo plasmonic resonance to sensitize the graphene of the first layer so as to correspondingly modify one or more photo-absorption characteristics of the graphene of the first layer.

5. The apparatus of claim 4, wherein the one or more photo-absorption characteristics of the graphene of the first layer comprise one or more of:
   wavelength or frequency selectivity, and absorption ratio.

6. The apparatus of claim 1, wherein the plasmonic structure in the second layer comprises one or more of:
   nanovoid structure, and a nanoparticle structure.

7. The apparatus of claim 6, wherein the second layer is configured to undergo plasmonic resonance in dependence on one or more resonance parameters of the nanovoid or nanoparticle structure.

8. The apparatus of claim 7, wherein the resonance parameters comprise one or more of:
   particle diameter, void diameter, particle spacing, void spacing, density of voids per unit volume, density of particles per unit volume, distribution of particles, distribution of voids, thickness of the nanovoid structure, thickness of the nanoparticle structure, and properties of the materials used in the plasmonic structure(s).

9. The apparatus of claim 1, wherein the first layer is disposed on top of or underneath the second layer with respect to the source of electromagnetic signalling.

10. The apparatus of claim 1, wherein the sub-layers of the second layer comprise:
    a first sub-layer comprising a dielectric substrate;
    a second sub-layer positioned on the first sub-layer, wherein a conductive material of the second sub-layer comprises one or more of a metal and indium tin oxide; and
    a plasmonically-active third sub-layer comprising the plasmonic structure wherein a conductive material of the third sub-layer comprises a metal and has a plurality of nanoscale voids spaced apart to form nanoscale bubbles in the third sub-layer, the third sub-layer being positioned on the second sub-layer, wherein the first, second and third sub-layer arrangement within the second layer is thereby configured to undergo plasmonic resonance in response to receiving electromagnetic signalling to thereby sensitize the graphene of the first layer to detection of particular spectral characteristics of received electromagnetic signalling corresponding to the particular plasmonic resonance of the second layer.

11. An apparatus comprising:
a first layer for detecting electromagnetic signalling, wherein the first layer comprises graphene; and
a second layer positioned proximate to the first layer and configured to undergo plasmonic resonance in response to receiving electromagnetic signaling, the second layer comprising a first sub-layer, a second sub-layer positioned proximate to the first sub-layer and comprising at least one conductive material, and a plasmonically-active third sub-layer positioned on the first layer and on the second sub-layer and comprising a plurality of nanoscale voids spaced apart in the third sub-layer;
wherein the graphene of the first layer is sensitized to detection of particular spectral characteristics of received electromagnetic signalling corresponding to the particular plasmonic resonance of the second layer at a plurality of nanovoid structures in the second layer, wherein the diameters/sizes, spacings, and density of the nanovoid structures are controllable for specific tuning and enhancing of a functionality of the graphene of the first layer.

12. An apparatus comprising:
a first layer for detecting electromagnetic signalling, wherein the first layer comprises graphene; and
a second layer positioned proximate to the first layer and configured to undergo plasmonic resonance in response to receiving electromagnetic signaling, the second layer comprising,
a first sub-layer comprising a dielectric substrate,
a second sub-layer comprising a conductive material, and positioned on the first sub-layer, and
a third sub-layer comprising the plasmonic structure, the third sub-layer being positioned on the second sub-layer, wherein the first, second and third sub-layer arrangement within the second layer is thereby configured to undergo plasmonic resonance in response to receiving electromagnetic signalling to thereby sensitize the graphene of the first layer to detection of particular spectral characteristics of received electromagnetic signalling corresponding to the particular plasmonic resonance of the second layer;
wherein the graphene of the first layer is sensitized to detection of particular spectral characteristics of received electromagnetic signalling corresponding to the particular plasmonic resonance of the second layer at at least one plasmonic structure in the second layer, wherein at least one of the size, spacing, and density of the plasmonic structure is controllable for specific tuning and enhancing of a functionality of the graphene of the first layer.

* * * * *